United States Patent
Kukita et al.

(10) Patent No.: US 11,156,571 B2
(45) Date of Patent: Oct. 26, 2021

(54) SUBSTANCE DETECTION SYSTEM AND SUBSTANCE DETECTION METHOD

(71) Applicants: NIHON DEMPA KOGYO CO., LTD., Tokyo (JP); JAPAN AEROSPACE EXPLORATION AGENCY, Tokyo (JP)

(72) Inventors: Hiroyuki Kukita, Hokkaido (JP); Shunichi Wakamatsu, Hokkaido (JP); Tsuyoshi Shiobara, Hokkaido (JP); Takayuki Ishikawa, Saitama (JP); Eiji Miyazaki, Tokyo (JP); Yuta Tsuchiya, Tokyo (JP)

(73) Assignees: NIHON DEMPA KOGYO CO., LTD., Tokyo (JP); JAPAN AEROSPACE EXPLORATION AGENCY, Tokyo (JP)

( * ) Notice: Subject to any disclaimer, the term of this patent is extended or adjusted under 35 U.S.C. 154(b) by 204 days.

(21) Appl. No.: 16/409,884

(22) Filed: May 13, 2019

(65) Prior Publication Data
US 2019/0265177 A1     Aug. 29, 2019

Related U.S. Application Data

(63) Continuation of application No. PCT/JP2017/024718, filed on Jul. 5, 2017.

(30) Foreign Application Priority Data

Nov. 14, 2016   (JP) ............................. JP2016-221918

(51) Int. Cl.
*G01N 25/08*     (2006.01)
*G01K 11/26*     (2006.01)
(Continued)

(52) U.S. Cl.
CPC ............. *G01N 25/08* (2013.01); *G01K 11/26* (2013.01); *G01N 5/04* (2013.01); *H03B 5/04* (2013.01);
(Continued)

(58) Field of Classification Search
CPC ...... H03B 5/04; H03B 5/32; H03B 2200/007; H03B 2200/008; G01N 25/08; G01N 5/04;
(Continued)

(56) References Cited

U.S. PATENT DOCUMENTS

| | | |
|---|---|---|
| 4,561,286 A | 12/1985 | Sekler et al. |
| 4,917,499 A | 4/1990 | Champetier et al. |

(Continued)

FOREIGN PATENT DOCUMENTS

| | | |
|---|---|---|
| CN | 37105638 | 6/1988 |
| CN | 101467034 | 6/2009 |

(Continued)

OTHER PUBLICATIONS

"International Search Report (Form PCT/ISA/210) of PCT/JP2017/024718," dated Oct. 10, 2017, with English translation thereof, pp. 1-8.

(Continued)

*Primary Examiner* — Arnold M Kinkead
(74) *Attorney, Agent, or Firm* — JCIPRNET

(57) ABSTRACT

A substance detection system and a substance detection method are provided. The temperature identifying portion identifies a surface temperature of the quartz substrate, based on a difference between a deviation of the fundamental wave frequency from at least any predetermined reference fundamental wave frequency of the reference crystal resonator and the detecting crystal resonator and a deviation of the third harmonic frequency from a predetermined reference (Continued)

third harmonic frequency. The substance identifying portion identifies a temperature at which a contaminant attached to the detecting crystal resonator is desorbed from the detecting crystal resonator to identify the contaminant based on the temperature at which the contaminant is desorbed. The temperature is identified based on a difference between the fundamental wave frequency of the reference crystal resonator and the fundamental wave frequency of the detecting crystal resonator measured by the frequency measuring portion and the temperature identified by the temperature identifying portion.

11 Claims, 12 Drawing Sheets

(51) Int. Cl.
  H03B 5/04    (2006.01)
  H03B 5/32    (2006.01)
  G01N 5/04    (2006.01)
  G01N 29/036  (2006.01)
  G01N 29/44   (2006.01)
  G01N 29/30   (2006.01)
  G01N 29/24   (2006.01)
  G01N 29/02   (2006.01)
  G01N 29/34   (2006.01)

(52) U.S. Cl.
  CPC ............ *H03B 5/32* (2013.01); *G01N 29/022* (2013.01); *G01N 29/036* (2013.01); *G01N 29/2443* (2013.01); *G01N 29/30* (2013.01); *G01N 29/348* (2013.01); *G01N 29/4436* (2013.01); *G01N 29/4454* (2013.01); *G01N 2291/014* (2013.01); *G01N 2291/021* (2013.01); *G01N 2291/0256* (2013.01); *G01N 2291/0426* (2013.01); *H03B 2200/007* (2013.01); *H03B 2200/008* (2013.01)

(58) Field of Classification Search
  CPC ............ G01N 2291/021; G01N 29/00; G01N 29/022; G01N 29/036; G01N 29/30; G01N 29/2443; G01N 29/348; G01N 29/4436; G01N 2291/014; G01N 2291/0256; G01K 11/26
  USPC ............ 73/579, 54.24, 64.53, 580; 331/158
  See application file for complete search history.

(56) References Cited

U.S. PATENT DOCUMENTS

| | | | |
|---|---|---|---|
| 5,869,763 A | 2/1999 | Vig et al. | |
| 7,530,340 B1 | 5/2009 | Jellinek et al. | |
| 2005/0229677 A1 | 10/2005 | Tuller et al. | |
| 2006/0179918 A1 | 8/2006 | Liu | |
| 2008/0156098 A1* | 7/2008 | Vetelino ............... | G01N 29/036 73/579 |
| 2009/0113997 A1 | 5/2009 | Okaguchi et al. | |
| 2015/0061783 A1 | 3/2015 | Yorita | |
| 2015/0168351 A1 | 6/2015 | Ushigome | |

FOREIGN PATENT DOCUMENTS

| | | |
|---|---|---|
| CN | 201409125 | 2/2010 |
| CN | 104426478 | 3/2015 |
| CN | 104541148 | 4/2015 |
| CN | 204694582 | 10/2015 |
| GB | 2071323 | 9/1981 |
| JP | S6039530 | 3/1985 |
| JP | H01501168 | 4/1989 |
| JP | 2014021018 | 2/2014 |
| TW | 201628080 | 8/2016 |
| WO | 2016104433 | 6/2016 |

OTHER PUBLICATIONS

Naoyuki Iida, et al., "Development of QCM-based thermal desorption spectroscopy for space applications," the 30th Sensor Symposium on Sensors, Micromachines and Applied Systems Ronbunshu, Nov. 2013, pp. 1-6.

"Search Report of Europe Counterpart Application", dated Jun. 17, 2020, pp. 1-5.

"Written Opinion of the International Searching Authority (Form PCT/ISA/237) of PCT/JP2017/024718," dated Oct. 10, 2017, with English translation thereof, pp. 1-9.

Office Action of China Counterpart Application, with English translation thereof, dated Jun. 22, 2021, pp. 1-8.

Lu et al., "Development of Quartz Crystal Oscillator Microbalance Array Gas Sensor Test System", Journal of Transducer Technology, vol. 23, Dec. 2004, with English translation thereof, pp. 100-102.

\* cited by examiner

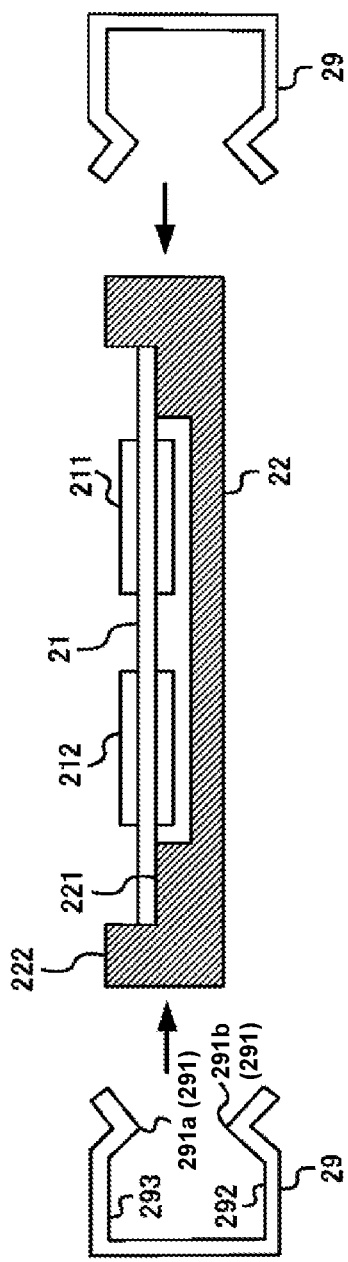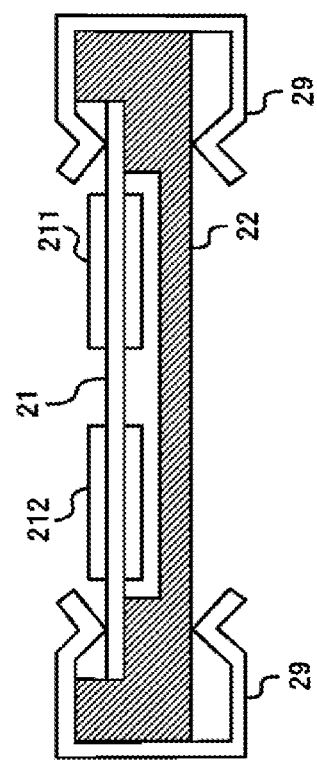
FIG. 2A
FIG. 2B

SUBSTANCE DETECTION SYSTEM AND SUBSTANCE DETECTION METHOD

CROSS-REFERENCE TO RELATED APPLICATIONS

The present application is a continuation application of International Application number PCT/JP2017/024718, filed on Jul. 5, 2017, which claims priority under 35 U.S.C § 119(a) to Japanese Patent Application No. 2016-221918, filed on Nov. 14, 2016. The contents of this application are incorporated herein by reference in their entirety.

BACKGROUND

The present invention relates to a substance detection system and a substance detection method to detect a substance using a crystal resonator.

Conventionally, a Quartz Crystal Microbalance (QCM) sensor using a crystal resonator has been known. The QCM sensor is configured to detect presence/absence of a substance based on a difference between a resonance frequency of a reference crystal resonator as a reference and a resonance frequency of a detecting crystal resonator to which the substance is attached. Patent Document 1 discloses a device that detects contaminants (hereinafter referred to as outgas) emitted from an object, using a crystal as a reference and a crystal that detects the substance. The device disclosed in Patent Document 1 is configured to measure a temperature at which the outgas attached to the detecting crystal is desorbed to identify a type of the outgas, using a platinum sensor disposed between the reference crystal and the detecting crystal.

In the device described in Patent Document 1: Japanese Unexamined Patent Application Publication No. H01-501168 (hereinafter Patent Document 1), the reference crystal and the detecting crystal are formed of different crystal elements. Accordingly, a difference between a temperature characteristic of the reference crystal and a temperature characteristic of the detecting crystal is large, thus causing a problem that a detection accuracy of the outgas is low.

In the device described in Patent Document 1, the platinum sensor that measures the temperature is disposed between the reference crystal and the detecting crystal. Accordingly, an error occurs between the temperature at which the outgas is actually desorbed from the detecting crystal and the temperature measured by the platinum sensor. Also in this point, there has been a problem that the detection accuracy of the desorption temperature of the outgas is low in the conventional device.

Therefore, the present invention has been made in consideration of these points, and it is an object of the present invention to improve a detection accuracy of a substance using a crystal.

SUMMARY

A substance detection system according to a first aspect of the present invention includes a reference crystal resonator, a detecting crystal resonator, an oscillation control portion, a frequency measuring portion, a temperature identifying portion, and a substance identifying portion. The reference crystal resonator and the detecting crystal resonator are formed on a single quartz substrate. The oscillation control portion sequentially oscillates the reference crystal resonator and the detecting crystal resonator at a fundamental wave frequency and a third harmonic frequency. The frequency measuring portion measures at least any of fundamental wave frequencies of the reference crystal resonator and the detecting crystal resonator and third harmonic frequencies of the reference crystal resonator and the detecting crystal resonator. The temperature identifying portion identifies a surface temperature of the quartz substrate, based on a difference between a deviation of the fundamental wave frequency from at least any predetermined reference fundamental wave frequency of the reference crystal resonator and the detecting crystal resonator and a deviation of the third harmonic frequency from a predetermined reference third harmonic frequency. The substance identifying portion identifies a temperature at which a contaminant attached to the detecting crystal resonator is desorbed from the detecting crystal resonator to identify the contaminant based on the temperature at which the contaminant is desorbed. The temperature is identified based on at least any of a difference between the fundamental wave frequency of the reference crystal resonator and the fundamental wave frequency of the detecting crystal resonator or a difference between the third harmonic frequency of the reference crystal resonator and the third harmonic frequency of the detecting crystal resonator measured by the frequency measuring portion, and the temperature identified by the temperature identifying portion.

A substance detection method according to a second aspect of the present invention is a method for detecting a substance using a QCM sensor module including a reference crystal resonator and a detecting crystal resonator formed on a single quartz substrate. The substance detection method include: a step of measuring a reference fundamental wave frequency of an oscillation signal output while oscillating the reference crystal resonator at a fundamental wave frequency, a step of measuring a fundamental oscillation frequency for detection of an oscillation signal output while oscillating the detecting crystal resonator at a fundamental wave frequency, a step of measuring a reference third harmonic frequency of an oscillation signal output while oscillating the reference crystal resonator at a third harmonic frequency, a step of measuring a 3rd overtone oscillation frequency for detection of an oscillation signal output while oscillating the detecting crystal resonator at a third harmonic frequency, a step of identifying a surface temperature of the quartz substrate, based on a difference between a deviation of the reference fundamental wave frequency from a predetermined reference fundamental wave frequency and a deviation of the reference third harmonic frequency from a predetermined reference third harmonic frequency, and a step of identifying a temperature at which a contaminant attached to the detecting crystal resonator is desorbed from the detecting crystal resonator to identify the contaminant based on the temperature at which the contaminant is desorbed. The temperature is identified based on a difference between the reference fundamental wave frequency and the fundamental oscillation frequency for detection, and the identified temperature.

BRIEF DESCRIPTION OF THE DRAWINGS

FIGS. 2A and 2B are drawings which describe a structure for fixing a quartz substrate to a base substrate.

DESCRIPTION OF EMBODIMENTS

Hereinafter, the present invention will be described through exemplary embodiments of the present invention, but the following exemplary embodiments do not limit the invention according to the claims, and not all of the combinations of features described in the exemplary embodiments are necessarily essential to the solution means of the invention.

First Embodiment

[Outline of Substance Detection System]

A substance detection system according to an embodiment is a system that detects presence/absence of gas (hereinafter referred to as outgas) containing contaminants emitted from an object as a measured target and identifies a type of the outgas when detecting the outgas. A substance detection system 1 detects the outgas such that the outgas attaches to a QCM sensor module to vary a resonance frequency of a crystal resonator included in the QCM sensor module.

The outgas has a property to be likely to attach to a part where the temperature is low. Therefore, the substance detection system 1 cools an electrode to −190° C. or less with liquid nitrogen and then, heats the electrode to +125° C. with a heater, a Peltier element, or the like, thus varying the temperature of the electrode in a wide range. When the electrode is heated, the outgas attached to the electrode is desorbed from the electrode at a temperature corresponding to the type of the outgas. The substance detection system 1 is configured to identify the temperature at which the outgas is desorbed with a variation in the resonance frequency to identify the type of the outgas corresponding to the identified temperature.

Figure 1:
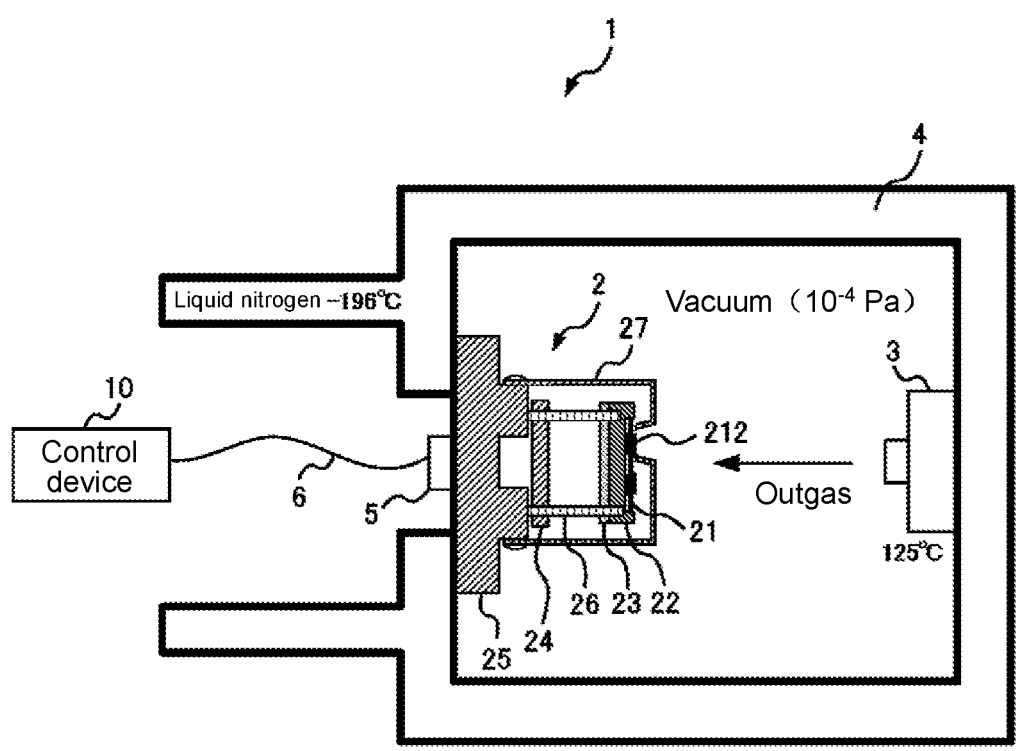
FIG. 1 is a drawing schematically illustrating a cross-sectional surface of a substance detection system according to an embodiment.

FIG. 1 is a drawing schematically illustrating a cross-sectional surface of the substance detection system 1 according to the embodiment.

The substance detection system 1 gradually heats the electrode of the crystal resonator included in the QCM sensor module to measure a rate at which the outgas attached to the electrode is desorbed in order to identify the type of the substance contained in the outgas.

The substance detection system 1 includes a QCM sensor module 2, a detection-target-substance housing portion 3, a cooling system 4, an output interface 5, a connection cable 6, and a control device 10. The QCM sensor module 2 includes a quartz substrate 21, a base substrate 22, a heater 23, an oscillator circuit module 24, a base member 25, a binding socket 26, and a cover 27.

The QCM sensor module 2 includes a dual-electrode crystal resonator formed on the quartz substrate 21 configured from one crystal element. One crystal resonator among a plurality of crystal resonators included in the QCM sensor module 2 functions as a reference crystal resonator that oscillates insusceptible to the outgas containing a detection target substance. Another crystal resonator functions as a detecting crystal resonator whose resonance frequency varies such that the outgas is attached.

The base substrate 22 is a substrate that fixes the quartz substrate 21. The base substrate 22 is, for example, a ceramic substrate such as a Low Temperature Co-fired Ceramics (LTCC) substrate.

The heater 23 is a heating portion that heats the quartz substrate 21 via the base substrate 22. The heater 23, which is a resistor disposed on a side opposite to a side on which the quartz substrate 21 is disposed of the base substrate 22, heats the quartz substrate 21. The heater 23 adjusts a heating amount based on control from the control device 10. The heater 23 may be a resistor formed on an inner layer of the base substrate 22.

The oscillator circuit module 24 includes an oscillator circuit that oscillates the crystal resonator included in the quartz substrate 21 corresponding to the control from the control device 10. The oscillator circuit module 24 outputs a reference oscillation signal by the reference crystal resonator and a detecting oscillation signal by the detecting crystal resonator. The oscillation signal output by the oscillator circuit module 24 is input to the control device 10 via the output interface 5 and the connection cable 6.

The base member 25 is a member that fixes the oscillator circuit module 24. The binding socket 26 is a member that electrically connects the oscillator circuit module 24 to the quartz substrate 21. A pin (not illustrated) that is electrically connected to the quartz substrate 21 and projecting from the base substrate 22 is inserted into the binding socket 26. The quartz substrate 21 is connected to the oscillator circuit module 24 via the pin and the binding socket 26. Thus, even though the temperature varies in the wide range with the heating by the heater 23 to generate expansion and contraction in the respective portions, the binding socket 26 can absorb a stress generated by the expansion and contraction.

The detection-target-substance housing portion 3 houses a measurement object as a target to be inspected whether to emit the outgas. The detection-target-substance housing portion 3 has an internal temperature maintained at, for example, 125° C. Maintaining the internal temperature of the detection-target-substance housing portion 3 at a high temperature facilitates generation of the outgas by the measurement object.

The cooling system 4 houses the QCM sensor module 2 and the detection-target-substance housing portion 3. The cooling system 4 has an inner wall that is internally maintained under vacuum ($10^{-4}$ Pa or less). Liquid nitrogen is filled between an outer wall and an inner wall of the QCM sensor module 2. The base member 25 of the QCM sensor module 2 is maintained at about −190° C.

The control device 10 detects the generation of the outgas based on the reference oscillation signal and the detecting oscillation signal output by the QCM sensor module 2. The control device 10 is, for example, a measuring device including a computer.

The detail will be described later, but the control device 10 identifies a surface temperature of the quartz substrate 21, based on a difference between a deviation of a frequency (hereinafter referred to as a reference fundamental wave frequency) of a fundamental wave of the reference crystal resonator from a fundamental wave frequency as a reference and a deviation of a frequency (hereinafter referred to as a reference third harmonic frequency) of a third harmonic of the reference crystal resonator from a third harmonic frequency as a reference. The control device 10 detects attachment of the outgas to the detecting crystal resonator, based on the difference between a frequency of the reference oscillation signal and a frequency of the detecting oscillation signal and the identified temperature. The control device 10 also can identify a type of the substance contained in the outgas with reference to a temperature characteristic of a difference between the frequency of the reference oscillation signal and the frequency of the detecting oscillation signal for each type of the substance contained in the outgas, which has been preliminarily identified.

[Structure of QCM Sensor Module 2]

The following describes a distinctive structure of the QCM sensor module 2. Conventionally, the quartz substrate has been electrically connected to the base substrate with a conductive adhesive. However, when the conductive adhesive is used, the outgas occurs from the conductive adhesive. Thus, there has been a problem that a measurement accuracy of the outgas emitted from a measurement target reduces. When the conductive adhesive is used, there has been also a problem that a difference occurs between a capacity of a reference crystal resonator 211 and a capacity of a detecting crystal resonator 212 to change the characteristic. Therefore, in the QCM sensor module 2 according to the embodiment, the quartz substrate 21 is fixed to the base substrate 22 using an elastic fixing member.

Figure 3:
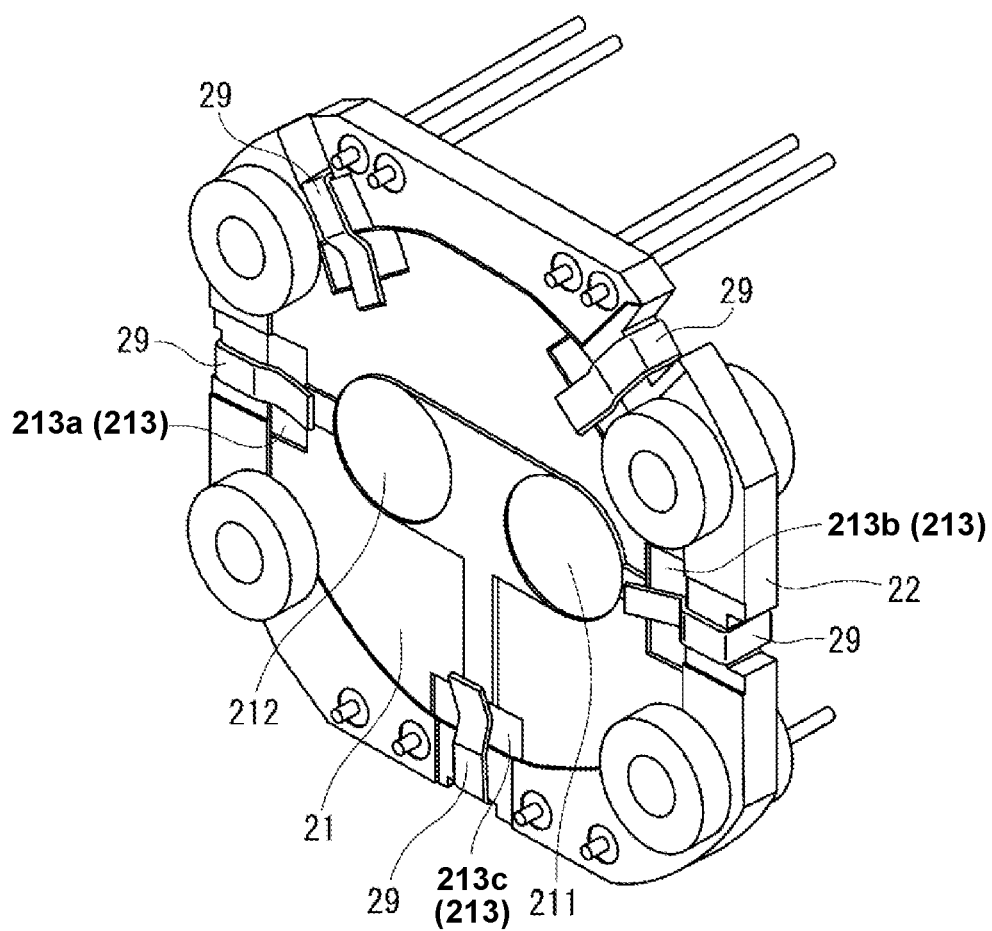
FIG. 3 is a perspective view of a state where the quartz substrate is fixed to the base substrate.

FIGS. 2A and 2B are drawings which describe a structure that fixes the quartz substrate 21 to the base substrate 22. FIG. 3 is a perspective view of a state where the quartz substrate 21 is fixed to the base substrate 22. The quartz substrate 21 is fixed to the base substrate 22 with a clip 29 as the fixing member. The clip 29 is mounted at a position electrically connected to the reference crystal resonator 211 and the detecting crystal resonator 212. Specifically, a plurality of clips 29 are mounted so as to contact a plurality of electrodes 213 (electrodes 213a to 213c) connected to the reference crystal resonator 211 and the detecting crystal resonator 212. The reference crystal resonator 211 and the detecting crystal resonator 212 are electrically connected to a conductive pattern formed on a back surface of the base substrate 22 via the clip 29.

FIG. 2A illustrates a state where the quartz substrate 21 is placed on a step 221 formed on the base substrate 22. In this state, the quartz substrate 21 is not fixed to the base substrate 22. In the state in FIG. 2A, the clips 29 are moved in arrow directions from the right and left and pushed to positions where the clips 29 closely contact the base substrate 22. The clip 29, which is formed of a metallic thin plate on which gold plating has been performed, has an elasticity. A protrusion 291 is formed on at least one end portion of the clip 29. The protrusion 291 has a distal end side formed in an oblique direction while separating from a lower surface 292 inside the clip 29.

A distance between the lower surface 292 inside the clip 29 and a top surface 293 inside the clip 29 is larger than a height of the base substrate 22 at a position on which an extruding part 222 has been formed. In contrast, a distance between a distal end of the protrusion 291a and a distal end of the protrusion 291b of the clip 29 is smaller than the height of the base substrate 22 at the position on which the extruding part 222 has been formed. The distance between the distal end of the protrusion 291a and the distal end of the protrusion 291b inside the clip 29 is equal to or less than a length obtained by adding a thickness of the quartz substrate 21 to a height of the base substrate 22 at a position where the step 221 has been formed. The protrusion 291b contacts an electrode disposed on the back surface of the base substrate 22.

The clip 29 has the elasticity, and the distal end sides of the protrusion 291a and the protrusion 291b are formed in the oblique direction. Thus, even after the clip 29 is moved in the arrow direction and the clip 29 touches the extruding part 222, applying a force in the arrow direction expands the clip 29 to increase the distance between the lower surface 292 and the top surface 293. Then, after the protrusion 291a and the protrusion 291b move beyond the extruding part 222, the distance between the lower surface 292 and the top surface 293 of the clip 29 decreases, and the protrusion 291a pushes the quartz substrate 21 against a side of the base substrate 22. Thus, as illustrated in FIG. 2B, the clip 29 sandwiches the quartz substrate 21 and the base substrate 22 in a close contact state to fix the quartz substrate 21 to the base substrate 22.

When the clip 29 is thus used, differently from the case using the conductive adhesive, the outgas that affects the measurement does not occur, and the capacity is also unaffected, thus ensuring improvement in the measurement accuracy. Furthermore, the substance detection system 1 varies the temperature in a wide range when measuring presence/absence of the outgas. Thus, the quartz substrate 21 and the base substrate 22 extend and contract, but the clip 29 having a stretch can reduce the stress that occurs on the quartz substrate 21 and the base substrate 22. Accordingly, the configuration to fix the quartz substrate 21 to the base substrate 22 using the clip 29 without the conductive adhesive is appropriate for the substance detection system 1 that measures the outgas.

Figure 4:
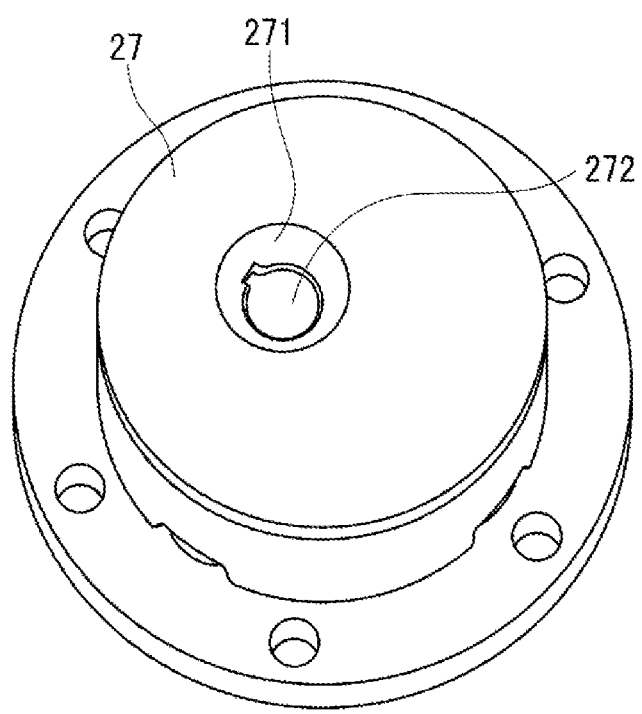
FIG. 4 is a drawing illustrating a structure of a cover.

FIG. 4 is a drawing illustrating a structure of the cover 27. The cover 27 has a shape covering the reference crystal resonator 211 so that the outgas is not attached to the reference crystal resonator 211. The cover 27 has a depressed portion 271 and a hole 272 formed on the depressed portion 271. The detecting crystal resonator 212 is exposed at the hole 272 so that the outgas is attached to the detecting crystal resonator 212.

[Configuration of Oscillator Circuit Module 24]

Figure 5:
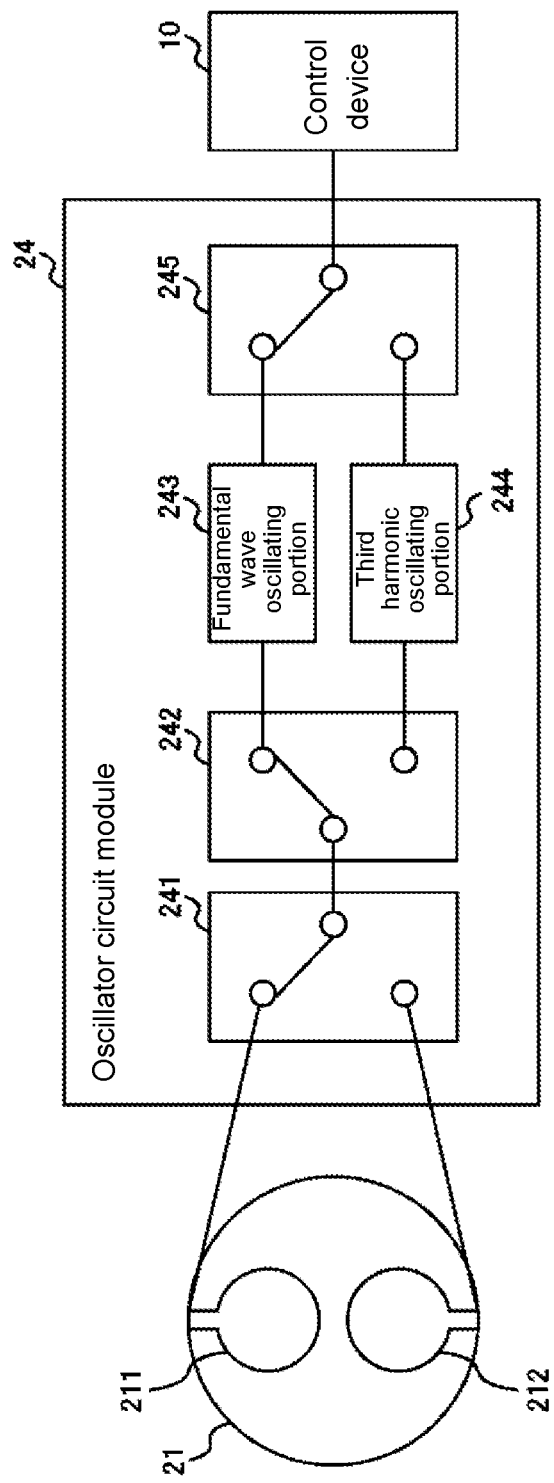
FIG. 5 is a drawing illustrating a configuration of an oscillator circuit module.

FIG. 5 is a drawing illustrating a configuration of the oscillator circuit module 24. The oscillator circuit module 24 functions as an oscillation control portion that sequentially oscillates the reference crystal resonator 211 and the detecting crystal resonator 212 at the fundamental wave frequency and the third harmonic frequency, based on control of a frequency measuring portion 12 included in the control device 10 illustrated in FIG. 6. The oscillator circuit module 24 includes a switch 241, a switch 242, a fundamental wave oscillating portion 243, a third harmonic oscillating portion 244, and a switch 245. The oscillator circuit module 24 operates based on control information received from the control device 10.

The switch 241 is a switch to select any one of the reference crystal resonator 211 and the detecting crystal resonator 212 as a crystal resonator to be oscillated. The switch 242 is a switch to select whether to oscillate the crystal resonator selected by the switch 241 with the fundamental wave or the third harmonic.

The fundamental wave oscillating portion 243 includes an oscillator circuit that oscillates the crystal resonator selected by the switch 241 with the fundamental wave. The fundamental wave oscillating portion 243 inputs a fundamental wave oscillation signal generated by oscillating the crystal resonator to the switch 245. Similarly, the third harmonic oscillating portion 244 includes an oscillator circuit that oscillates the crystal resonator selected by the switch 241 with the third harmonic. The third harmonic oscillating portion 244 inputs a third harmonic oscillation signal generated by oscillating the crystal resonator to the switch 245.

The switch 245 is a switch to select which oscillation signal of the fundamental wave oscillation signal output by the fundamental wave oscillating portion 243 and the third harmonic oscillation signal output by the third harmonic oscillating portion 244 will be input to the control device 10. The switch 245 inputs the oscillation signal received from the selected oscillator circuit to the control device 10.

The oscillator circuit module 24 has a feature to switch whether to oscillate the reference crystal resonator 211 at the fundamental wave frequency or the third harmonic frequency by time sharing, based on the control of the control device 10. The oscillator circuit module 24 may switch whether to oscillate the detecting crystal resonator 212 at the fundamental wave frequency or the third harmonic frequency by time sharing.

The oscillator circuit module 24 oscillates the reference crystal resonator 211 and the detecting crystal resonator 212 in, for example, the following order.

(Step 1) To oscillate the reference crystal resonator 211 at the fundamental wave frequency.

(Step 2) To oscillate the reference crystal resonator 211 at the third harmonic frequency.

(Step 3) To oscillate the detecting crystal resonator 212 at the fundamental wave frequency.

(Step 4) To oscillate the detecting crystal resonator 212 at the third harmonic frequency.

The oscillator circuit module 24 returns to Step 1 after Step 4. The execution order from Step 1 to Step 4 is optional.

The control device 10 identifies the surface temperature of the quartz substrate 21 and measures an emission of the outgas, based on the oscillation signal switched by the time sharing as described above. The following describes a configuration and an operation of the control device 10.

[Functional Configuration of Control Device 10]

Figure 6:
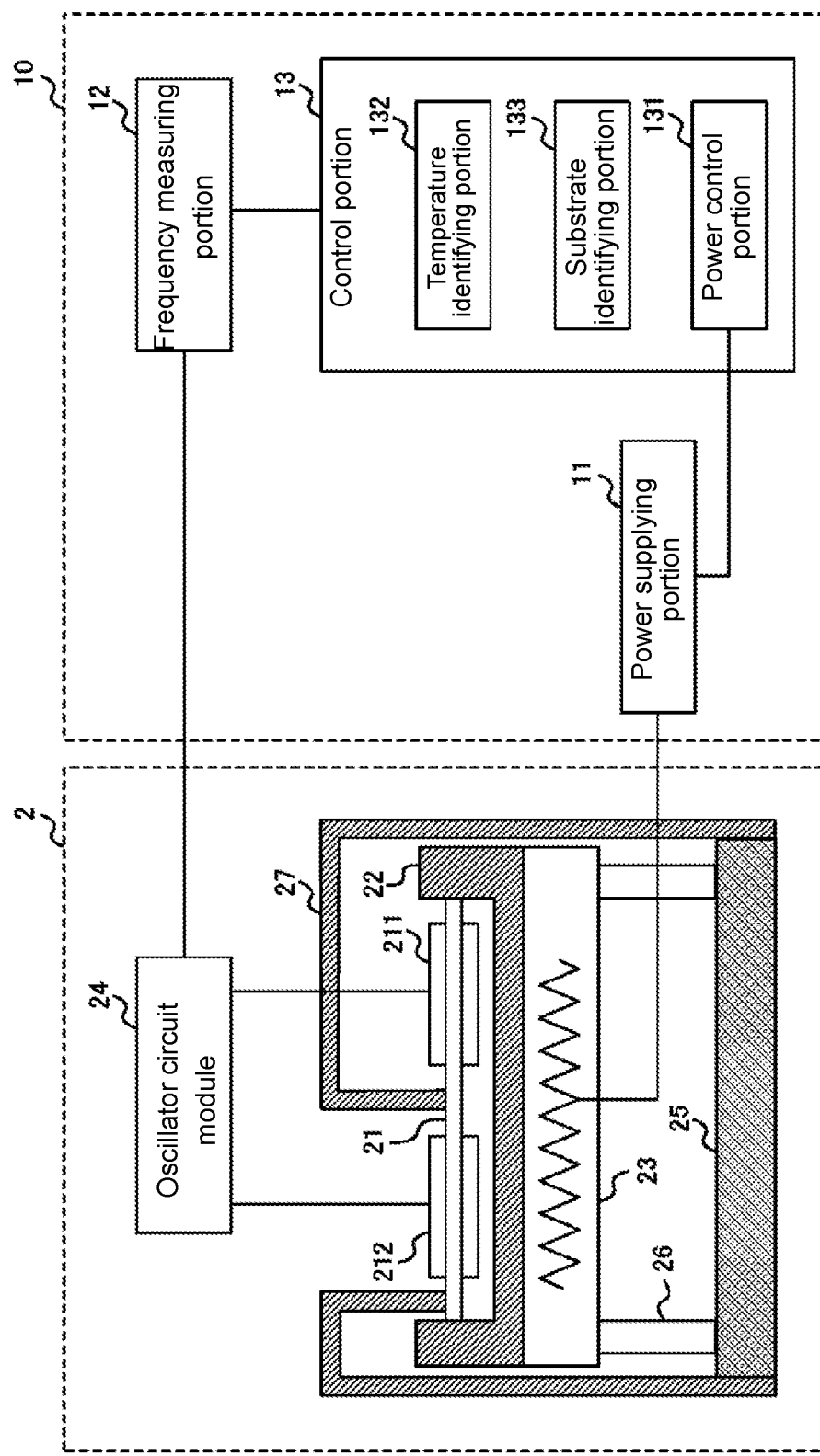
FIG. 6 is a drawing illustrating a functional configuration of a control device.

FIG. 6 is a drawing illustrating a functional configuration of the control device 10. The control device 10 includes a power supplying portion 11, a frequency measuring portion 12, and a control portion 13. The control portion 13, which is, for example, a Central Processing Unit (CPU) or a general-purpose PC, executes a program stored in a storage medium (not illustrated) such as a non-volatile memory or a hard disk to function as a power control portion 131, a temperature identifying portion 132, and a substance identifying portion 133.

The power supplying portion 11 supplies electric power to heat the heater 23. The power supplying portion 11 varies the electric power to be supplied, based on control of the power control portion 131.

The frequency measuring portion 12 measures frequencies of the fundamental wave oscillation signal and the third harmonic oscillation signal received from the oscillator circuit module 24. Specifically, the frequency measuring portion 12 measures the reference fundamental wave frequency as a fundamental wave resonance frequency of the reference crystal resonator 211, the reference third harmonic frequency as a third harmonic resonance frequency of the reference crystal resonator 211, and the fundamental oscillation frequency for detection as a fundamental wave resonance frequency of the detecting crystal resonator 212 to notify the control portion 13 of the respective frequencies. The frequency measuring portion 12 may further measure the 3rd overtone oscillation frequency for detection as a third harmonic resonance frequency of the detecting crystal resonator 212 to notify the control portion 13 of the measured 3rd overtone oscillation frequency for detection.

The power control portion 131 controls the electric power supplied by the power supplying portion 11 to vary the surface temperature of the quartz substrate 21, based on the temperature identified by the temperature identifying portion 132. The power control portion 131 functions as a heating control portion that controls the heating amount in the heater 23, based on a difference between the temperature identified by the temperature identifying portion 132 and a target temperature. The power control portion 131 controls the electric power, for example, to raise the surface temperature of the quartz substrate 21 by 1° C. for one minute.

The temperature identifying portion 132 identifies the surface temperature of the quartz substrate 21, based on the reference fundamental wave frequency and the reference third harmonic frequency notified by the frequency measuring portion 12. Specifically, the temperature identifying portion 132 identifies the surface temperature of the quartz substrate 21, based on a difference between a deviation of the reference fundamental wave frequency from a predetermined reference fundamental wave frequency and a deviation of the reference third harmonic frequency from a predetermined reference third harmonic frequency. The predetermined reference fundamental wave frequency and the predetermined reference third harmonic frequency are, for example, the fundamental wave frequency and the third harmonic frequency at 25° C.

Figure 7A:
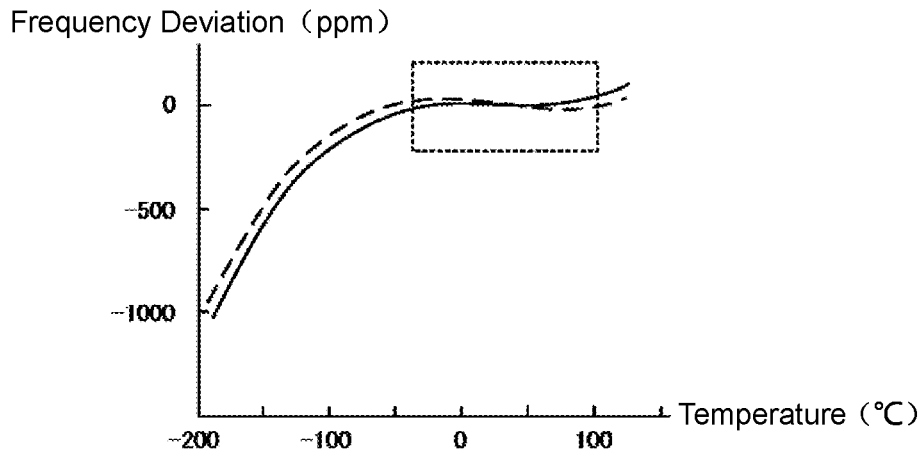
FIGS. 7A to 7C are drawings which describe a temperature characteristic of a frequency deviation.
Figure 7B:
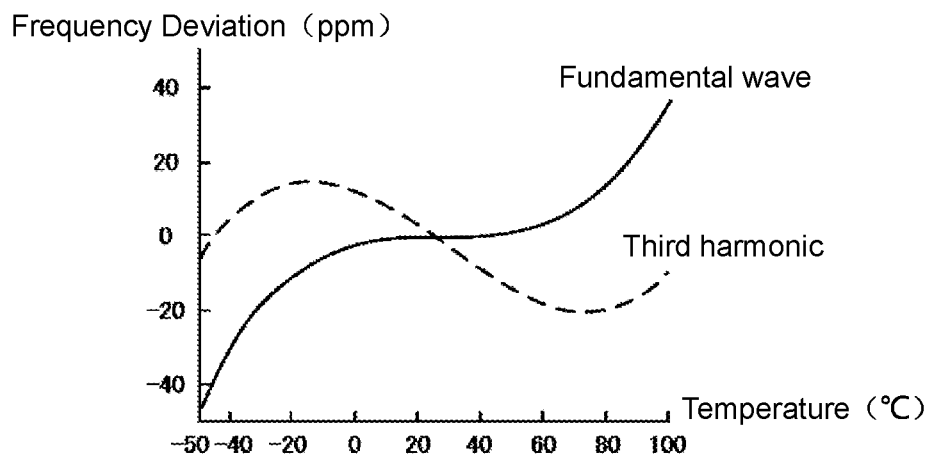
Figure 7C:
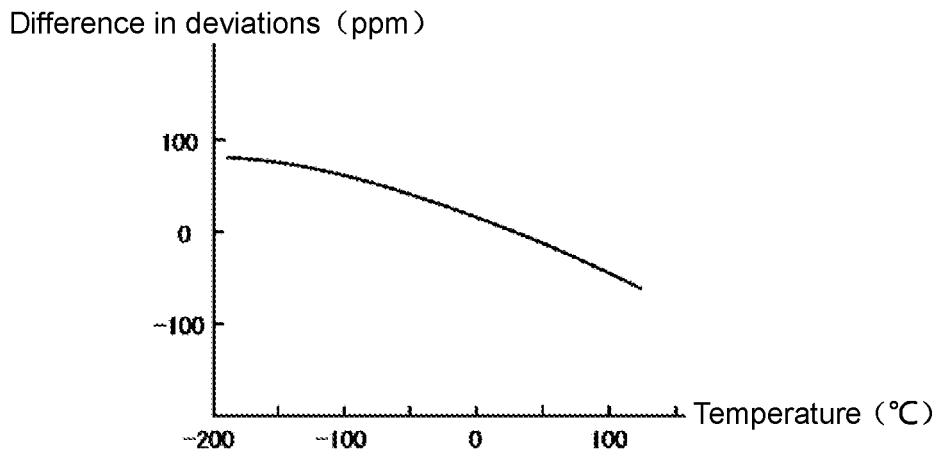

FIGS. 7A to 7C are drawings which describe a temperature characteristic of a frequency deviation. FIG. 7A illustrates a temperature characteristic of the deviation of the reference fundamental wave frequency from the reference fundamental wave frequency and a temperature characteristic of the deviation of the reference third harmonic frequency from the reference third harmonic frequency. A solid line indicates a state where the deviation of the reference fundamental wave frequency varies with temperature. A dashed line indicates a state where the deviation of the reference third harmonic frequency varies with temperature.

FIG. 7B is an enlarged view of a range from −50° C. to 100° C. in FIG. 7A. As illustrated in FIG. 7B, the reference fundamental wave frequency is lower than the reference fundamental wave frequency at a temperature lower than 25° C. as a reference when the frequency deviation is calculated, and the reference fundamental wave frequency is higher than the reference fundamental wave frequency at a temperature equal to or more than 25° C. Conversely, the reference third harmonic frequency tends to be higher than the reference third harmonic frequency at the temperature lower than 25° C., and the reference third harmonic frequency is lower than the reference third harmonic frequency at the temperature equal to or more than 25° C.

FIG. 7C is a drawing illustrating a variation in temperature of a difference between a frequency deviation of the third harmonic frequency and a frequency deviation of the fundamental wave frequency. As illustrated in FIG. 7C, it turns out that the difference between the frequency deviation of the third harmonic frequency and the frequency deviation of the fundamental wave frequency varies at an approximately constant gradient with respect to the temperature variation. Specifically, in a range from −190° C. to 125° C., the difference between the frequency deviation of the third harmonic frequency and the frequency deviation of the fundamental wave frequency approximately linearly varies from +82.5 ppm to −63.7 ppm, and a variation amount of the difference in the frequency deviations per 1° C. as a unit temperature is 146.2 ppm÷315° C.=0.464 ppm.

The temperature identifying portion 132, using this characteristic, can identify the surface temperature of the quartz substrate 21, based on a result obtained by dividing a magnitude of the difference between the deviation of the reference fundamental wave frequency and the deviation of the reference third harmonic frequency by the variation amount of the difference in the frequency deviations per unit temperature. For example, when the difference between the deviation of the reference fundamental wave frequency and the deviation of the reference third harmonic frequency is 46.4 ppm, since 46.4÷0.464=100, the temperature identifying portion 132 can calculate the surface temperature of the quartz substrate 21 as 25° C.−100° C.=−75° C.

Figure 8:
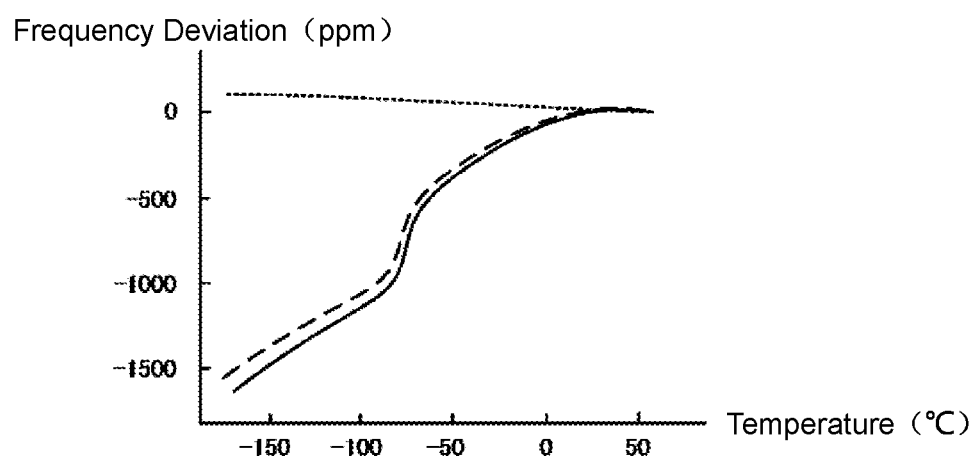
FIG. 8 is a drawing illustrating a temperature characteristic of a difference between a frequency deviation of a fundamental wave frequency and a frequency deviation of a third harmonic frequency in a detecting crystal resonator.

FIG. 8 is a drawing illustrating a temperature characteristic of the difference between the frequency deviation of the fundamental wave frequency and the frequency deviation of the third harmonic frequency of the detecting crystal resonator 212. In FIG. 8, a solid line indicates a fundamental wave frequency deviation, a dashed line indicates a third harmonic frequency deviation, and a dotted line indicates a difference in these frequency deviations. As illustrated in FIG. 8, also for the difference in the frequency deviations of the detecting crystal resonator 212, the difference in the frequency deviations varies at an approximately constant proportion with respect to the variation in the unit temperature. Accordingly, the temperature identifying portion 132 may identify the surface temperature of the quartz substrate 21, based on a difference between a deviation of the fundamental oscillation frequency for detection from the predetermined reference fundamental wave frequency and a deviation of the 3rd overtone oscillation frequency for detection from the predetermined reference third harmonic frequency.

Subsequently, another function of the control portion 13 will be described by returning to FIG. 6. The substance identifying portion 133 identifies a temperature at which the outgas attached to the detecting crystal resonator 212 is desorbed from the detecting crystal resonator 212, based on at least any of the difference between the reference fundamental wave frequency and the fundamental oscillation frequency for detection measured by the frequency measuring portion 12 or the difference between the reference third harmonic frequency and the 3rd overtone oscillation frequency for detection measured by the frequency measuring portion 12, and the temperature identified by the temperature identifying portion 132. Identifying the temperature at which the outgas is desorbed can identify the type of the outgas.

Figure 9A:
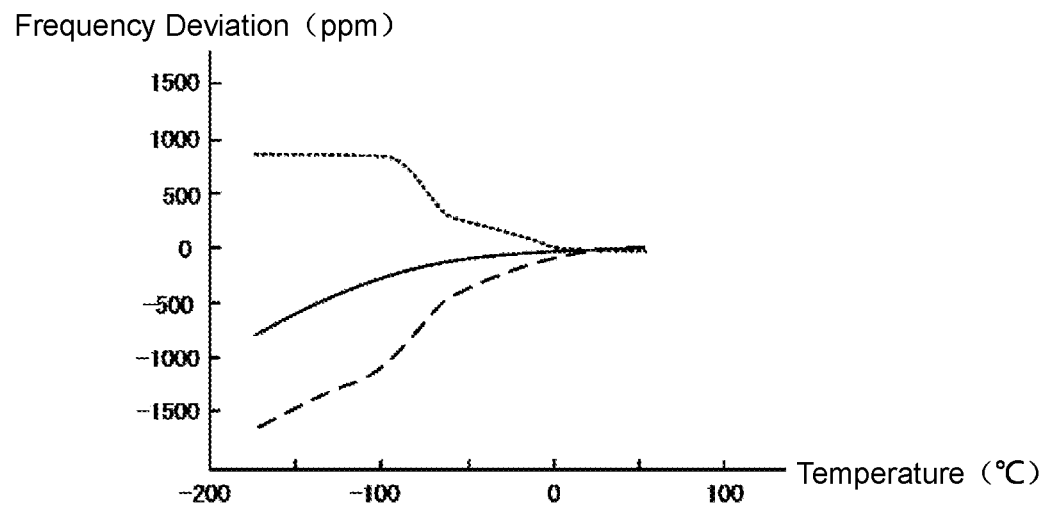
FIGS. 9A and 9B are drawings which describe a process that a substance identifying portion identifies a temperature at which outgas is desorbed from the detecting crystal resonator.
Figure 9B:
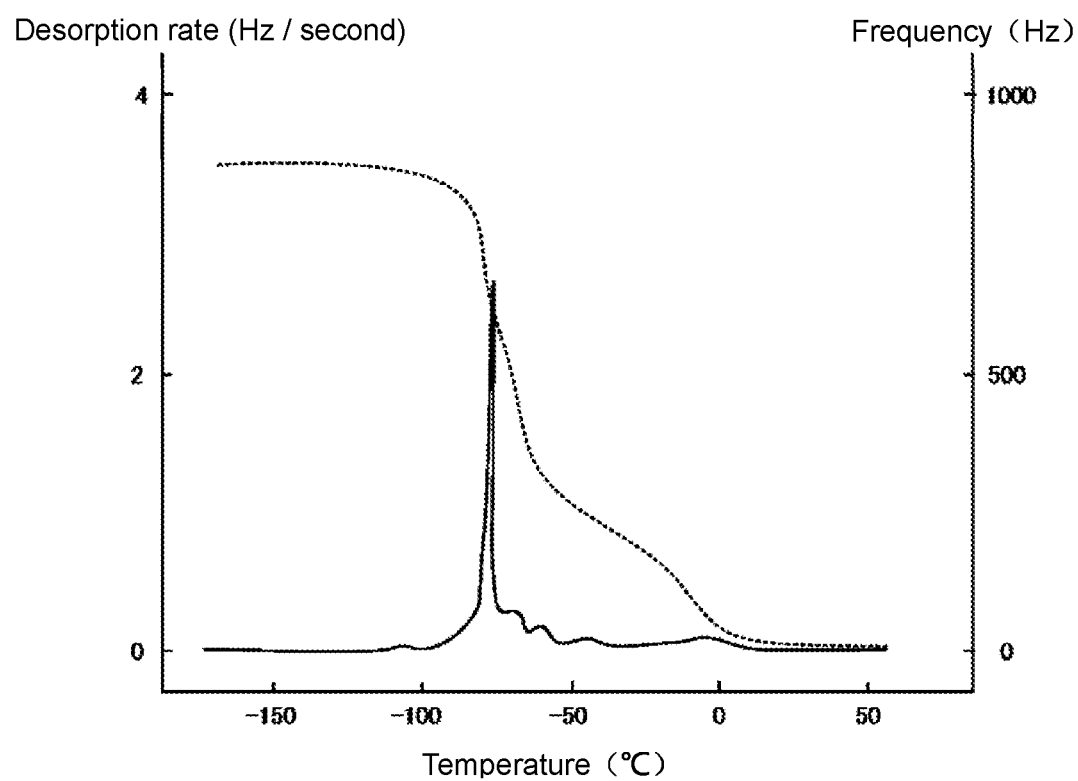

FIGS. 9A and 9B are drawings which describe a process that the substance identifying portion 133 identifies the temperature at which the outgas is desorbed from the detecting crystal resonator 212. FIG. 9A is a drawing illustrating temperature characteristics of the reference third harmonic frequency, the 3rd overtone oscillation frequency for detection, and the difference between the reference third harmonic frequency and the 3rd overtone oscillation frequency for detection.

A solid line in FIG. 9A indicates a state where the reference third harmonic frequency as the third harmonic frequency of the reference crystal resonator 211 varies with temperature. The frequency is indicated as the deviation from the frequency when the temperature is 25° C. A dashed line in FIG. 9A indicates a state where the 3rd overtone oscillation frequency for detection as the third harmonic frequency of the detecting crystal resonator 212 varies with temperature. A dotted line in FIG. 9A indicates a state where the difference between the reference third harmonic frequency and the 3rd overtone oscillation frequency for detection varies with temperature.

When the outgas is not attached to the detecting crystal resonator 212, the difference between the reference third harmonic frequency and the 3rd overtone oscillation frequency for detection is about 0 ppm. In contrast, in FIG. 9A, since the difference of about 900 ppm occurs in a region equal to or less than 100° C., it turns out that the outgas is attached to the detecting crystal resonator 212.

When the control of the power control portion 131 causes the heater 23 to increase a heat generation amount to raise the surface temperature of the quartz substrate 21 beyond 100° C., the difference between the reference third harmonic frequency and the 3rd overtone oscillation frequency for detection decreases. Especially, the difference rapidly decreases between −100° C. and −50° C., and it is thought that the outgas is desorbed from the substance identifying portion 133 at this point. Therefore, the substance identifying portion 133 identifies that the outgas is desorbed between −100° C. and −50° C.

A dotted line in FIG. 9B indicates the difference between the reference third harmonic frequency and the 3rd overtone oscillation frequency for detection illustrated in FIG. 9A by enlarging a range from −150° C. to 50° C. A solid line in FIG. 9B indicates a desorption rate obtained by differentiating the difference between the reference third harmonic frequency and the 3rd overtone oscillation frequency for detection indicated by the dotted line. When the power control portion 131 raises the surface temperature of the quartz substrate 21, for example, by 1° C. for one minute, the desorption rate is determined by the variation amount of the 3rd overtone oscillation frequency for detection per second.

The temperature at which the outgas is desorbed from the detecting crystal resonator 212 and the desorption rate when the outgas is desorbed from the detecting crystal resonator 212 are determined depending on the type of the substance contained in the outgas. Accordingly, the substance identifying portion 133 can identify the type of the outgas by identifying the desorption rate.

In the solid line in FIG. 9B, a peak seen in the proximity of −80° C. is considered caused by the desorption of water content from the substance identifying portion 133. A variation seen between −75° C. and −50° C. is considered caused by the desorption of the outgas. The substance identifying portion 133 can identify the desorption rate of the outgas based on the variation seen between −75° C. and −50° C. to identify the outgas having the type corresponding to the identified desorption rate.

FIGS. 9A and 9B illustrate an example that the substance identifying portion 133 identifies the desorption rate of the outgas based on the variation in the difference between the reference third harmonic frequency and the 3rd overtone oscillation frequency for detection that have a sensitivity higher than that of the fundamental wave. However, the substance identifying portion 133 may identify the desorption rate of the outgas based on the variation in the difference between the reference fundamental wave frequency and the fundamental oscillation frequency for detection.

The substance identifying portion 133 may identify the desorption rate of the outgas using both of the variation in the difference between the reference fundamental wave frequency and the fundamental oscillation frequency for detection and the variation in the difference between the reference third harmonic frequency and the 3rd overtone oscillation frequency for detection. The substance identifying portion 133 can prevent occurrence of the error caused by a frequency jump and a frequency dip to improve an accuracy in identifying the desorption temperature and the desorption rate of the outgas, using both of the variation in the difference between the reference fundamental wave frequency and the fundamental oscillation frequency for detection and the variation in the difference between the reference third harmonic frequency and the 3rd overtone oscillation frequency for detection.

[Operation Flowchart of Control Device 10]

Figure 10:
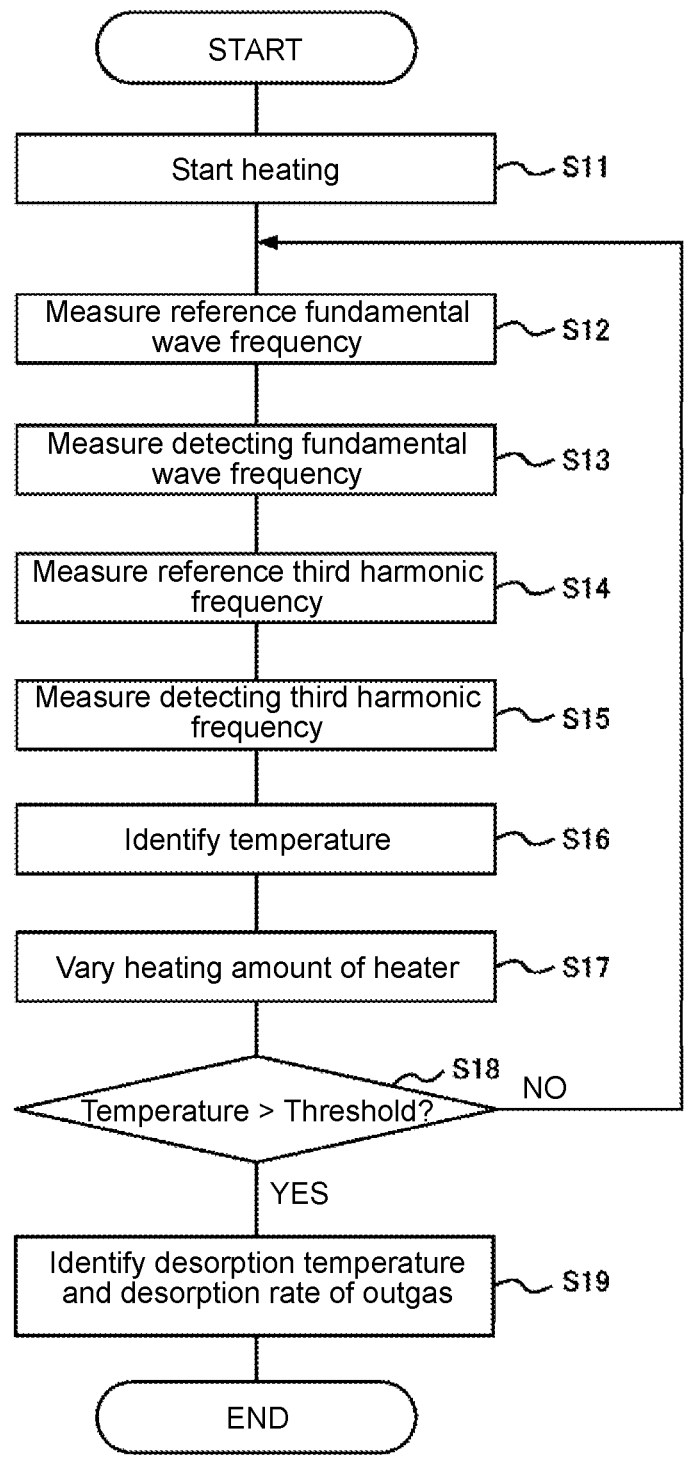
FIG. 10 is a flowchart of an operation that the control device identifies a desorption rate of the outgas.

FIG. 10 is a flowchart of an operation that the control device 10 identifies the desorption rate of the outgas. First, the flowchart in FIG. 10 starts from a state where the cooling system 4 is internally cooled at −190° C. or less, the outgas occurs from an object housed in the detection-target-substance housing portion 3, and a certain amount of outgas is attached to the detecting crystal resonator 212.

The power control portion 131 controls the power supplying portion 11 to start heating of the quartz substrate 21 by the heater 23 (Step S11). Subsequently, the control portion 13 instructs the frequency measuring portion 12 to measure the oscillation frequencies of the reference crystal resonator 211 and the detecting crystal resonator 212. Specifically, the control portion 13 causes the frequency measuring portion 12 to sequentially measure the fundamental wave frequency (the reference fundamental wave frequency) of the reference crystal resonator 211, the fundamental wave frequency (the fundamental oscillation frequency for detection) of the detecting crystal resonator 212, the third harmonic frequency (the reference third harmonic frequency) of the reference crystal resonator 211, and the third harmonic frequency (the 3rd overtone oscillation frequency for detection) of the detecting crystal resonator 212 (Steps S12 to S15). The order from Steps S12 to S15 is optional.

While the frequency measuring portion 12 measures the frequencies, the temperature identifying portion 132 identifies the surface temperature of the quartz substrate 21 based on, for example, the difference between the frequency deviation of the reference fundamental wave frequency and the frequency deviation of the reference third harmonic frequency (Step S16). Here, the temperature identifying portion 132 may store the frequencies measured in Steps S12 to S15 associated with the identified temperature in the storage medium.

Subsequently, the power control portion 131 controls the electric power supplied by the power supplying portion 11 based on the temperature identified by the temperature identifying portion 132 to vary the heating amount of the heater 23, thus raising the surface temperature of the quartz substrate 21 (Step S17). The control portion 13 determines whether the temperature identified by the temperature identifying portion 132 exceeds a threshold (for example, 125° C. as an upper limit temperature) (Step S18), and repeats the process from steps S12 to S17 until the temperature exceeds the threshold.

After the measurement from Steps S12 to S17 ends, the substance identifying portion 133, as illustrated in FIGS. 9A and 9B, identifies the desorption temperature and the desorption rate of the outgas, based on at least any of the variation in the difference between the reference fundamental wave frequency and the fundamental oscillation frequency for detection and the variation in the difference between the reference third harmonic frequency and the 3rd overtone oscillation frequency for detection (Step S19).

[Effect by Substance Detection System 1 in First Embodiment]

As described above, in the substance detection system 1, the power control portion 131 raises the surface temperature of the quartz substrate 21, while the oscillator circuit module 24 sequentially oscillates the reference crystal resonator 211 and the detecting crystal resonator 212 formed on a single quartz substrate 21 at the fundamental wave frequency and the third harmonic frequency. Then, the temperature identifying portion 132 identifies the surface temperature of the quartz substrate 21, based on the difference between the deviation of the fundamental wave frequency and the deviation of the third harmonic frequency of at least any of the reference crystal resonator 211 and the detecting crystal resonator 212.

The substance identifying portion 133 identifies the temperature and the desorption rate at which the outgas is desorbed from the detecting crystal resonator 212, based on at least any of the difference between the fundamental wave frequency of the reference crystal resonator 211 and the fundamental wave frequency of the detecting crystal resonator 212 or the difference between the third harmonic frequency of the reference crystal resonator 211 and the third harmonic frequency of the detecting crystal resonator 212, and the temperature identified by the temperature identifying portion 132. With the above-described configuration, the substance detection system 1 is configured to measure the surface temperature of the quartz substrate 21 with a high accuracy, thus improving the measurement accuracy in the desorption temperature and the desorption rate of the outgas.

Second Embodiment

Figure 11:
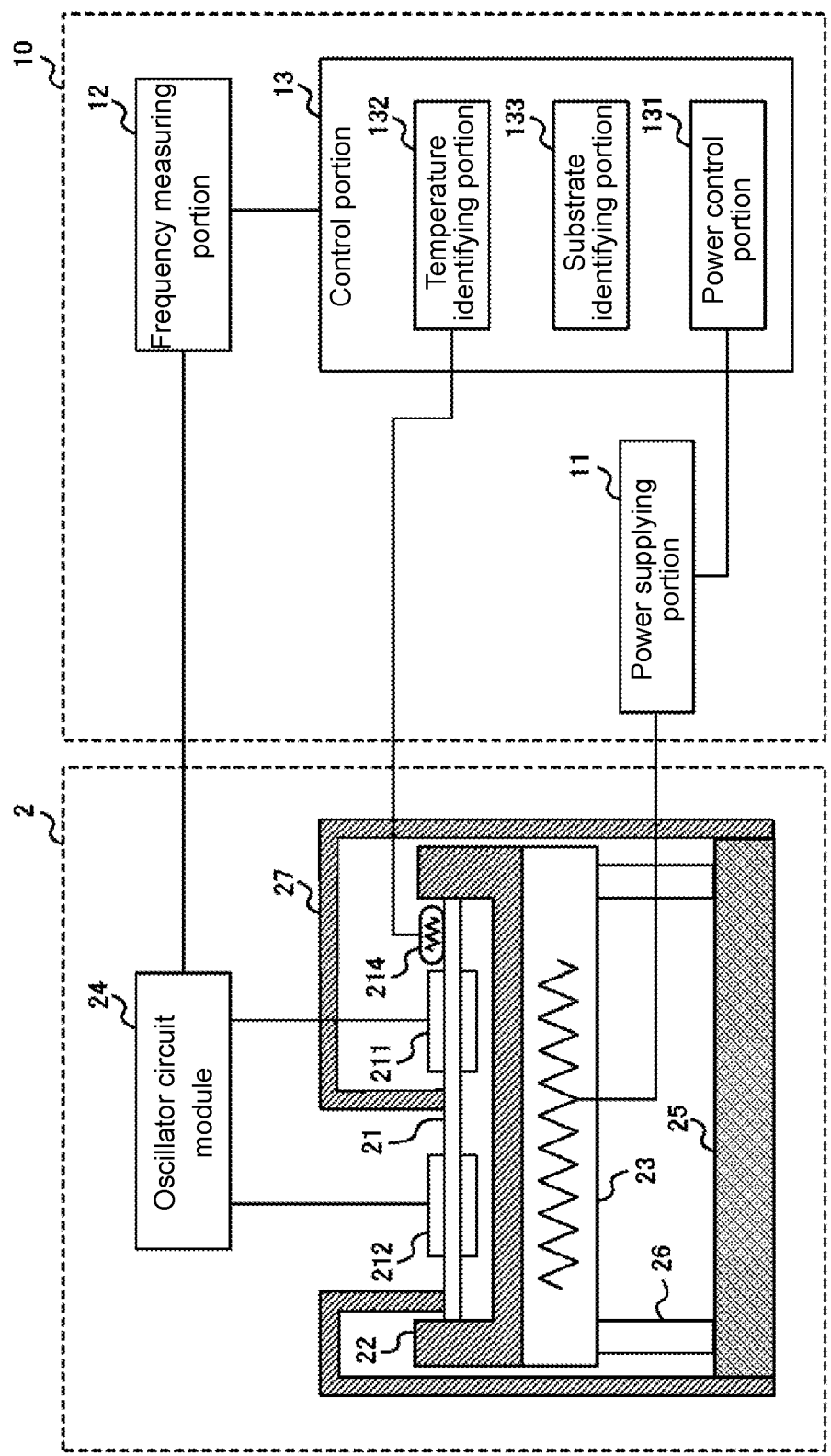
FIG. 11 is a drawing illustrating configurations of a QCM sensor module and a control device according to a second embodiment.

FIG. 11 is a drawing illustrating configurations of a QCM sensor module 2 and a control device 10 according to a second embodiment. The QCM sensor module 2 illustrated in FIG. 11 is different from the QCM sensor module 2 according to the first embodiment illustrated in FIG. 6 in that a temperature sensor 214 is disposed on the quartz substrate 21 and identical to the QCM sensor module 2 according to the first embodiment illustrated in FIG. 6 in other respects. The control device 10 illustrated in FIG. 11 is different from that in the first embodiment in that the temperature identifying portion 132 identifies the temperature based on a resistance value of the temperature sensor 214 and identical to that in the first embodiment in other respects.

The temperature sensor 214 is, for example, a platinum resistance thermometer sensor of Pt100 or Pt1000. The resistance value of the temperature sensor 214 increases as the temperature rises. The temperature identifying portion 132 identifies the resistance value of the temperature sensor 214 by, for example, measuring an output voltage or an output current of the temperature sensor 214 to identify the surface temperature of the quartz substrate 21 based on the identified resistance value.

Figure 12:
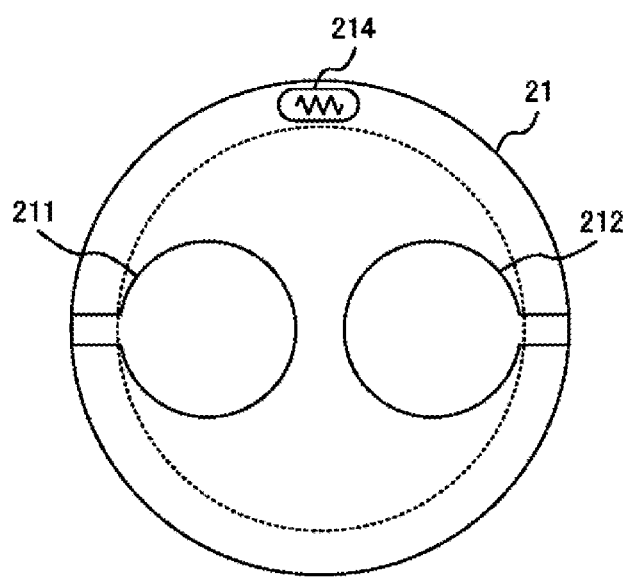
FIG. 12 is a drawing illustrating an exemplary position at which a temperature sensor is disposed.

FIG. 12 is a drawing illustrating an exemplary position at which the temperature sensor 214 is disposed. The temperature sensor 214 is disposed at a position as far away as possible from each of the reference crystal resonator 211 and the detecting crystal resonator 212. For example, when the distal end of the clip 29 is positioned in a region outside a dashed line in FIG. 12, the temperature sensor 214 is disposed in the region outside the dashed line. Thus disposing the temperature sensor 214 at the position far away from the reference crystal resonator 211 and the detecting crystal resonator 212 in the quartz substrate 21 can reduce an influence of the temperature sensor 214 on the oscillation of the reference crystal resonator 211 and the detecting crystal resonator 212.

The temperature sensor 214 is disposed at a position symmetrical with respect to the reference crystal resonator 211 and the detecting crystal resonator 212, that is, a position equidistant from the respective reference crystal resonator 211 and detecting crystal resonator 212. This can equalize the influences of the temperature sensor 214 on each of the reference crystal resonator 211 and the detecting crystal resonator 212, thus reducing the error.

While the present invention has been described above with reference to the embodiments, the technical scope of the present invention is not limited to the scope of the embodiments described above. It is apparent that a variety of variations and modifications of the above-described embodiments can be made by those skilled in the art. It is apparent from accompanying claims that such variations and modifications may also be encompassed by the technical scope of the present invention.

For example, the above-described embodiment describes the example that the cooling system 4 cools the QCM sensor module 2 with the liquid nitrogen and the heater 23 heats the QCM sensor module 2. However, without the liquid nitrogen, although a temperature control range is limited in, for example, −50 to +125° C., a heating and cooling bidirectional temperature control may be performed with the Peltier element.

The invention claimed is:

1. A substance detection system, comprising:
a reference crystal resonator and a detecting crystal resonator, formed on a single quartz substrate;
an oscillation control portion that sequentially oscillates the reference crystal resonator and the detecting crystal resonator at a fundamental wave frequency and a third harmonic frequency;
a frequency measuring portion that measures at least any of (i) a fundamental wave frequency of the reference crystal resonator and the detecting crystal resonator and (ii) a third harmonic frequency of the reference crystal resonator and the detecting crystal resonator;
a temperature identifying portion that identifies a surface temperature of the quartz substrate, based on a difference between (i) a deviation of the fundamental wave frequency from at least any predetermined reference fundamental wave frequency of the reference crystal resonator and the detecting crystal resonator and (ii) a deviation of the third harmonic frequency from a predetermined reference third harmonic frequency; and
a substance identifying portion that identifies a temperature at which a contaminant attached to the detecting crystal resonator is desorbed from the detecting crystal resonator, so as to identify the contaminant based on the temperature at which the contaminant is desorbed, and the temperature being identified based on (i) at least any of (1) a difference between the fundamental wave frequency of the reference crystal resonator and the fundamental wave frequency of the detecting crystal resonator or (2) a difference between the third harmonic frequency of the reference crystal resonator and the third harmonic frequency of the detecting crystal resonator measured by the frequency measuring portion, and (ii) the temperature identified by the temperature identifying portion.

2. The substance detection system according to claim 1, wherein
the oscillation control portion switches whether to oscillate the reference crystal resonator at the fundamental wave frequency or the third harmonic frequency by time sharing.

3. The substance detection system according to claim 1, wherein the oscillation control portion includes:
a fundamental wave oscillating portion that oscillates the reference crystal resonator and the detecting crystal resonator at the fundamental wave frequency;
a third harmonic oscillating portion that oscillates the reference crystal resonator and the detecting crystal resonator at the third harmonic frequency;
a resonator selecting portion that selects any one of the reference crystal resonator and the detecting crystal resonator; and
an oscillating-portion selecting portion that selects any one of the fundamental wave oscillating portion and the third harmonic oscillating portion.

4. The substance detection system according to claim 1, further comprising:
a heating portion that heats the quartz substrate based on the temperature identified by the temperature identifying portion.

5. The substance detection system according to claim 4, further comprising:
a heating control portion that controls a heating amount in the heating portion based on a difference between the temperature identified by the temperature identifying portion and a target temperature.

6. The substance detection system according to claim 1, further comprising:
a base substrate, on which the quartz substrate is disposed; and
a fixing member that sandwiches the base substrate and the quartz substrate to fix the quartz substrate to the base substrate.

7. The substance detection system according to claim 6, further comprising:
a heating portion, formed on an inner layer of the base substrate to heat the quartz substrate.

8. The substance detection system according to claim 6, further comprising:
a heating portion, disposed on a side opposite to a side on which the quartz substrate is disposed of the base substrate to heat the quartz substrate.

9. The substance detection system according to claim 1, wherein
the substance identifying portion identifies the temperature at which the contaminant is desorbed, based on a variation in the difference between the fundamental wave frequency of the reference crystal resonator and the fundamental wave frequency of the detecting crystal resonator or the difference between the third harmonic frequency of the reference crystal resonator and the third harmonic frequency of the detecting crystal resonator.

10. The substance detection system according to claim 1, further comprising:
a cover member that covers the reference crystal resonator and exposes the detecting crystal resonator.

11. A substance detection method for detecting a substance using a QCM sensor module including a reference crystal resonator and a detecting crystal resonator formed on a single quartz substrate, the substance detection method comprising:

measuring a reference fundamental wave frequency of an oscillation signal output, while oscillating the reference crystal resonator at a fundamental wave frequency;

measuring a fundamental oscillation frequency for detection of an oscillation signal output, while oscillating the detecting crystal resonator at a fundamental wave frequency;

measuring a reference third harmonic frequency of an oscillation signal output, while oscillating the reference crystal resonator at a third harmonic frequency;

measuring a 3rd overtone oscillation frequency for detection of an oscillation signal output, while oscillating the detecting crystal resonator at a third harmonic frequency;

identifying a surface temperature of the quartz substrate, based on a difference between a deviation of the reference fundamental wave frequency from a predetermined reference fundamental wave frequency and a deviation of the reference third harmonic frequency from a predetermined reference third harmonic frequency; and identifying a temperature at which a contaminant attached to the detecting crystal resonator is desorbed from the detecting crystal resonator, so as to identify the contaminant based on the temperature at which the contaminant is desorbed, the temperature being identified based on a difference between the reference fundamental wave frequency and the fundamental oscillation frequency for detection, and the identified temperature.

* * * * *